United States Patent [19]

Yang et al.

[11] Patent Number: 4,533,842
[45] Date of Patent: Aug. 6, 1985

[54] TEMPERATURE COMPENSATED TTL TO ECL TRANSLATOR

[75] Inventors: Tsen-Shau Yang, San Jose; Michael Allen, San Francisco, both of Calif.

[73] Assignee: Advanced Micro Devices, Inc., Sunnyvale, Calif.

[21] Appl. No.: 556,880

[22] Filed: Dec. 1, 1983

[51] Int. Cl.³ ............... H03K 19/092; H03K 19/086; H03K 19/003
[52] U.S. Cl. .................... 307/475; 307/446; 307/455; 307/297; 323/313
[58] Field of Search ............... 307/446, 455, 467, 562, 307/297, 310, 475, 563; 323/313, 315; 330/256, 330/261

[56] References Cited

U.S. PATENT DOCUMENTS

| | | | |
|---|---|---|---|
| 3,679,917 | 7/1972 | Bryant et al. | 307/310 X |
| 3,742,250 | 6/1973 | Kan | 307/446 X |
| 3,787,734 | 1/1974 | Dorler et al. | 307/455 |
| 3,959,666 | 5/1976 | Fett et al. | 307/475 |
| 3,970,876 | 7/1976 | Allen et al. | 307/455 X |
| 3,974,402 | 8/1976 | Fett et al. | 307/475 |
| 3,986,045 | 10/1976 | Lutz | 307/475 |
| 4,079,308 | 3/1978 | Brown | 307/297 X |
| 4,272,811 | 6/1981 | Wong | 365/190 |
| 4,393,315 | 7/1983 | Stickel et al. | 307/475 X |

FOREIGN PATENT DOCUMENTS

| | | | |
|---|---|---|---|
| 0083208 | 7/1983 | European Pat. Off. | 307/455 |
| 0089091 | 9/1983 | European Pat. Off. | 307/475 |
| 1762809 | 10/1970 | Fed. Rep. of Germany | 307/455 |

OTHER PUBLICATIONS

Taylor et al, "Logic Signal Level Shift Circuit"; IBM Tech. Disclosure Bull., vol. 12, No. 2, p. 296; 7/1969.
Bond, "TTL-To-ECL Logic Level Converter"; IBM Tech Discl. Bull., vol. 20, No. 10, p. 3976; 3/1978.
Blumberg et al., "Receiver Translator Circuit"; IBM Tech. Discl. Bull., vol. 24, No. 12, pp. 6467–6468; 5/1982.
Seidman, *Integrated Circuits Applications Handbook*, 1983, pp. 498–499.

*Primary Examiner*—Larry N. Anagnos
*Attorney, Agent, or Firm*—Patrick T. King; J. Vincent Tortolano; Mark A. Haynes

[57] ABSTRACT

A temperature compensated differential level shift circuit is provided. An ECL type buffered differential circuit employs a source of threshold voltage, $V_T$, which matches the temperature-dependent characteristic of the input section of the level shift circuit. In a preferred embodiment, a Schottky diode is provided in the output section of a bandgap reference voltage generator which matches the temperature dependence of a Schottky diode in the input section of the level shift circuit. As temperature shifts, the threshold voltage will shift in a manner that tracks the temperature-produced shift in the input voltage as it passes through the Schottky diode in the input section of the level shift circuit. Matched PNP or NPN transistors may also be used in the input section of the level shift circuit and in the output section of the bandgap reference voltage generator.

12 Claims, 9 Drawing Figures

TEMPERATURE COMPENSATED TTL TO ECL TRANSLATOR

BACKGROUND OF THE INVENTION

1. Field of the Invention

This invention relates to a TTL to ECL translator and, more particularly, relates to a TTL to ECL translator which has a fixed threshold voltage over a wide temperature range or whose threshold voltage is tailored to have a specified temperature coefficient.

2. Discussion of Background and Prior Art

Circuit designers are able to choose from a variety of logic families as they design integrated circuits. Their selection will be based on such criteria as power consumption, speed, processes available in-house and compatibility with related circuits. In many cases, in order to achieve compatibility with related circuits and yet utilize the logic family with the desired properties, a circuit designer will design the working circuit in one logic family, e.g. ECL, since it has the lowest propagation delay, and yet provide translators so that the integrated circuit accepts inputs and provides outputs at the voltage levels associated with another logic family, e.g. TTL. If the translators are fabricated on the chip, the integrated circuit would be designated a pseudo-ECL part. Otherwise, external translators can be used; such stand-alone translators include, e.g., the Motorola MC10124 Quad TTL to MECL Translator, the Motorola MC10125 Quad MECL to TTL Translator or the Motorola MC10177 Triple MECL to NMOS Translator. Translation or the shifting of voltage levels is required because each logic family has its own specification for the voltage levels which uniquely define the digital information. For example, with ECL a logic "1" is specified by any voltage more positive than about −0.9 volts while a logic "0" is indicated by any voltage more negative than −1.8 volts; for transistor-transistor logic (TTL) a digital "0" is indicated by any voltage less than 0.8 volts while a digital "1" is indicated for a voltage more positive than 2.0 volts. Similar conventions exist for other logic families such as I²L, MOS, RTL and DTL. The most widely utilized families, however, are TTL and ECL. To use integrated circuits of different logic families together it is thus necessary to shift voltage levels to preserve the digital information. While translation can either be carried out externally or on-chip, as described above, it is highly preferred to carry out such translation on board the integrated circuit chip. The use of external translators introduces additional delay and involves separate packages which have to be organized and housed on a printed circuit board.

Various designs for level shifting or translation have been advanced. See, e.g., T. S. Wong, "Write and Read Control Circuit for Semiconductor Memories", U.S. Pat. No. 4,272,811; D. L. Fett et al, "Logic Level Translator", U.S. Pat. No. 3,959,666; D. L. Fett et al, "Logic Level Translator", U.S. Pat. No. 3,974,402; and R. C. Lutz, "High Speed Logic Level Converter", U.S. Pat. No. 3,986,045. These prior art schemes typically are not temperature compensated over either the commercial temperature range (0°–70° C.) or the military temperature range (−55°–125° C.). The result is that the actual input translator threshold will vary from 0.9 volts to 1.9 volts which sometimes makes it difficult to meet the standard input specifications of a maximum low input of $V_{IL}=0.8$ v or of a minimum high input of $V_{IH}=2.0$ v. A typical prior art TTL to ECL translator is shown in FIG. 1. Transistors 12 and 13 comprise an ECL type differential buffer which have a threshold voltage impressed on the base of transistor 13 and an input voltage impressed on the base of transistor 12. Current from $V_{CC}$ supply line 23 to ground line 24 will toggle between transistors 12 and 13 depending on whichever base voltage is higher, the threshold voltage, $V_T$, or the input voltage, $V_{IN}$. The threshold voltage, $V_T$, is supplied at node b. In operation, as described in detail subsequently, the voltage drop across diode 14 will vary with temperature and therefore the voltage supplied at node b will vary so that the sense of the ECL output levels on terminals c and d for a given input voltage $V_{IN}$ are not necessarily the same over a wide range in temperature. As a consequence of these variations, noise margins are reduced. Also, it is not readily possible to test parts with definition because the threshold is too close to the specified limit values to be able to measure and guarantee. And, in order to fabricate a functional translator using the design of the prior art, the circuit had to be placed in a good location on the chip and given an adequate ground line.

It is therefore an object of the present invention to provide a TTL to ECL translator which is temperature compensated.

It is another object of the present invention to provide a translator for shifting logic signals from the levels of one family to the levels of another family which possesses wide noise margins.

It is an additional object of the present invention to provide a TTL to ECL translator which may readily be tested.

BRIEF DESCRIPTION OF THE DRAWINGS

For a more complete understanding of the temperature compensated logic level shifter of the present invention, reference may be had to the accompanying drawings which are incorporated herein by reference and in which.

SUMMARY OF THE INVENTION

A differential level shift circuit is provided which is temperature compensated. The ECL type buffered differential circuit employs a source of threshold voltage, $V_T$, which matches the temperature-dependent characteristic of the input section of the level shift circuit. In a preferred embodiment, a diode is provided in the output section of a bandgap reference voltage generator which matches the diode in the input section of the level shift circuit. Preferably, the diodes are Schottky diodes of the same rating. As temperature shifts, the threshold voltage will shift in a manner that tracks the temperature-produced shift in the input voltage as it passes through the Schottky diode in the input section of the level shift circuit thereby eliminating the temperature-dependence of the voltage at which logic level shifts are produced. In an alternate embodiment, a PNP or an NPN transistor in the input section of the level shift circuit is matched by a PNP or NPN transistor, respectively, in the output section of a bandgap reference voltage generator.

DESCRIPTION OF THE PREFERRED EMBODIMENT

Due to the high performance available with ECL logic, ECL is being used in an increasing number of integrated circuits. Many of the integrated circuits consist entirely of ECL circuitry and naturally accept inputs at ECL logic levels and provide outputs at ECL logic levels. Other circuits are pseudo-ECL since they perform their internal functions with ECL logic at the voltage levels of ECL logic but accept inputs at TTL logic levels and provide outputs at TTL logic levels or at the levels of some other logic family. Examples of pseudo-ECL parts include the National 2901 Bipolar 4-Bit Microprocessor and the AMD 2916 16-Bit Microprocessor. In order to avoid the degradation of the internal ECL logic, it is desirable to shift from TTL to ECL levels in pseudo-ECL parts on board the integrated circuit part by means which produce a true translation over specified temperature ranges and yet allows wide noise margins.

Figure 1:
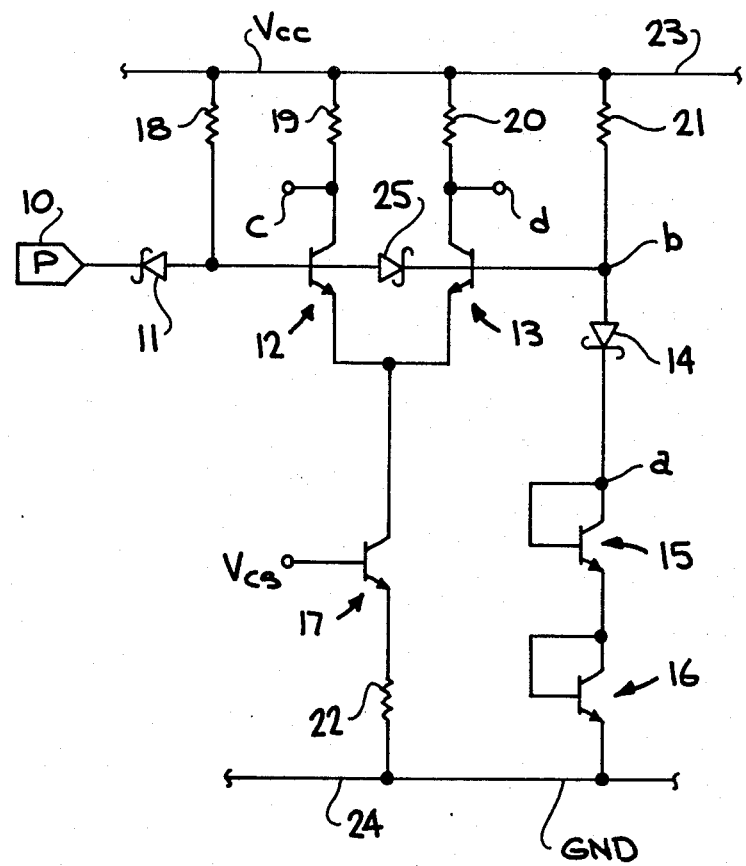
FIG. 1 is a circuit schematic of a level shift circuit of the prior art.

A typical prior art level shift circuit is shown in FIG. 1. Here, the input voltage, $V_{IN}$, is supplied on pin 10 and passes through diode 11 onto the base of transistor 12. Since the emitters of transistors 12 and 13 are coupled through a transistor to a ground line, typically the ECL $V_{EE}$ level of $-5.4$ volts, and the collectors are connected, respectively, through resistors 19 and 20 to the common $V_{CC}$ supply line 23, one or the other of transistors 12 or 13 will be conducting at any time depending upon the relative voltages on their bases. A threshold voltage, $V_T$, is supplied on the base of transistor 13. The threshold voltage is generated through transistors 15 and 16 and across diode 14. It is intended that if the input voltage, $V_{IN}$, impressed on pin 10 is less than 1.5 volts, then transistor 12 should be off and transistor 13 on thereby signifying a digital 0 or low state. The ECL inverting output on terminal c will be high and the non-inverting output on terminal d will be low. On the other hand, if the input voltage, $V_{IN}$, is greater than 1.5 volts, then transistor 12 is intended to be on and transistor 13 off thereby signifying a digital 1 or high state. The ECL non-inverting output on terminal d will be high and the inverting output on terminal c will be low. It is the threshold voltage, $V_T$, which will determine the voltage at which transistor 12 will turn on and transistor 13 will turn off and vice versa. Thus, it is generally desirable that $V_T$ be stable with changes in temperature. If it were precisely constant over temperature, however, the input voltage, $V_{IN}$, as received on the base of transistor 12 would still vary due to the temperature dependence of diode 11. The constancy of $V_T$ is a first order concern; the value of $V_{IN}$ as received on the base of transistor 12 is a second order concern. Both are dealt with in the preferred embodiment of temperature compensated translator of the present invention.

Figure 4:
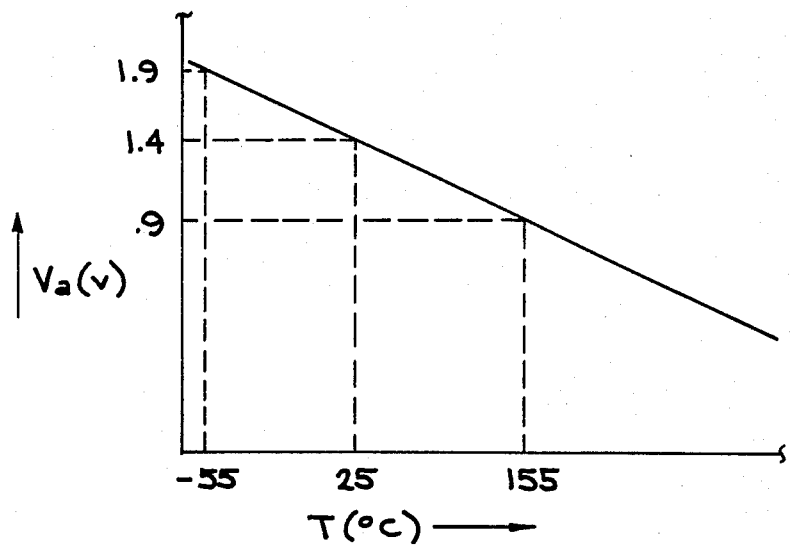
FIG. 4 is a graph showing the voltage drop across a diode as a function of temperature.

In FIG. 1, the threshold voltage, $V_T$, at node b is determined by the voltage at node a plus the voltage drop across diode 14. For TTL the value of $V_T$ has been set by convention to be 1.4 volts plus the drop across Schottky diode 14. The potential at node a is readily established at 1.4 volts because a typical voltage drop of a diode connected transistor is 0.7 volts at a room temperature of 25° C. Thus, the effective diode drops across the junctions of transistors 15 and 16 will provide a 1.4 volt differential voltage at 25° C. at node a. However, the diode drop will vary with temperature with a temperature-dependence of $-1.8$ mv/°C. This is shown in FIG. 4 in which the voltage at node a, $V_a$, is shown as a function of temperature. Thus, at the bottom end of the military specification range, $-55°$ C., the voltage at node a will be 1.9 volts; at the high end of the military specification range, 155° C., the voltage at node a will be 0.9 volts. This variation will be reflected at node b even if diode 14 is replaced by a resistor matched to resistor 21. The variation in $V_T$ at node b is highly undesirable since noise margins are reduced almost to zero as discussed subsequently.

Figure 5:
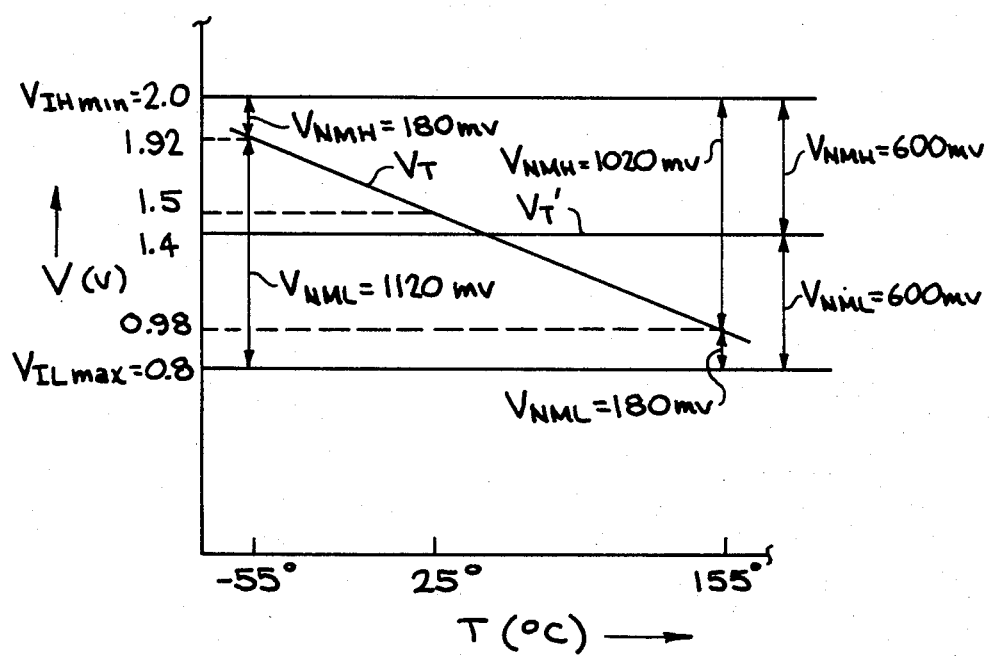
FIG. 5 is a diagram illustrating threshold voltages for the prior art, $V_T$, and for the present invention, $V_T$, $V_{ILmax}$ and $V_{IHmin}$.

The degradation in noise margin, $V_{NM}$, produced by variations in the threshold voltage $V_T$ is shown in FIG. 5. The variation of $V_T$ with temperature for the prior art circuit of FIG. 1 is shown as the diagonal line. In order to have unambiguous digital information it is essential that the input voltage for a digital "1" be no lower than a $V_{IHmin}$ value of 2 volts and the input voltage for a digital "0" be no greater than a $V_{ILmax}$ value of about 0.8 volts. Therefore, as a consequence of the variation of $V_T$ in the prior art, almost no noise margin is retained at high temperatures for $V_{ILmax}$ and at low temperatures for $V_{IHmin}$ as both are reduced to about 180 mv. This unfortunate result occurs with the level shift circuit of the prior art notwithstanding the use of the bandgap reference voltage $V_{CS}$ on the base of main current source transistor 17 since this only controls the total current that passes through either transistor 12 or 13 whereas it is the level at which there is a shift and not the magnitude of the current that determines the correspondence between a given TTL input logic level and an associated ECL output logic level. With the temperature compensated circuit of the present invention, the threshold voltage $V_T$, is nearly constant so that noise margins of approximately 600 mv are maintained over the entire military specification temperature range.

Figure 3:
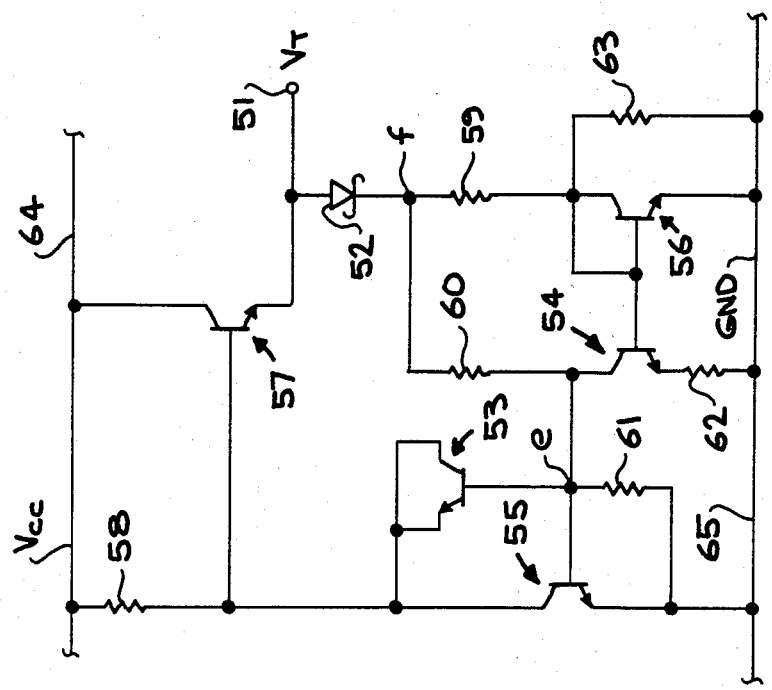
FIG. 3 is a threshold voltage generator for supplying the threshold voltage in the level shifter of FIG. 2.
Figure 2:
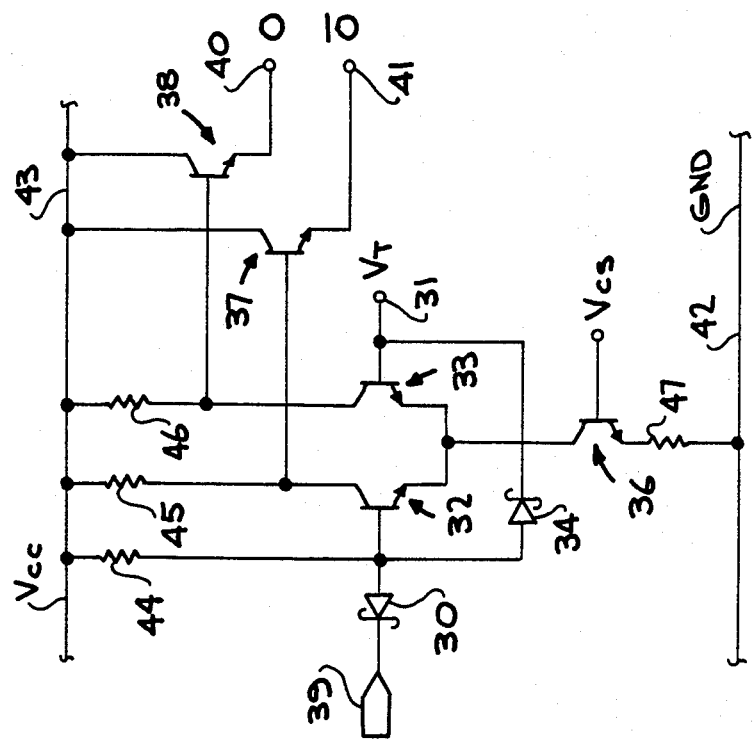
FIG. 2 is a circuit schematic of a level shift circuit employing a threshold voltage $V_T$ to determine the threshold for producing a shift in level.

The temperature compensated TTL to ECL translator of the present invention may be understood by reference to FIGS. 2 and 3. In FIG. 2 a level shift circuit having a differential format incorporating transistors 32 and 33 is shown. The overall circuit is similar to that of the prior art except that output transistors 37 and 38, respectively, are shown on the collectors of transistors 32 and 33 to provide the ECL non-inverting output (O) on terminal 40 and the ECL inverting output ($\overline{O}$) on terminal 41. The input voltage $V_{IN}$ is provided on pin 39 and passes through diode 30 to the base of transistor 32.

Schottky diode 34 clamps the voltage on the input to transistor 32 so that it does not rise to a harmful level, e.g. to a level approaching $V_{CC}$. Rather than utilizing a diode or a resistor and diode string to provide the threshold voltage $V_T$, however, the threshold voltage is supplied on the base of transistor 33 by the modified bandgap reference voltage generator of FIG. 3. A separate source for $V_T$ is required but this voltage may be distributed to a number of translators thereby saving the area previously occupied by the diode string within each translator.

The first order concern of supplying a stable threshold voltage, $V_T$, is met by the use of a bandgap reference voltage generator shown in FIG. 3. This bandgap reference voltage generator is of the type disclosed in G. W. Brown, "Resistor Ratio Circuit Construction", U.S. Pat. No. 4,079,308. Such bandgap reference voltage generators are known to provide stable on-chip reference voltages. See also, e.g., A. H. Seidman, *Integrated Circuits Applications Handbook*, pp. 498–499 (1983). By combining a bandgap reference voltage generator with a differential ECL-type level shifter of the prior art, the first order concern of constancy in threshold voltage is alleviated. However, there is typically a diode, such as Schottky diode 30, in the input section of the level shift circuit of FIG. 2 in order to allow the input to rise as high as 5.5 volts, $V_{CCmax}$, without harming the input transistor 32 of the differential pair 32, 33. As the input voltage $V_{IN}$ is impressed on pin 39, it will pass across Schottky diode 30 and be delivered to the base of transistor 32. Since there is approximately a −1.1 millivolts./°C. variation in performance of this diode, the input voltage $V_{IN}$ as received on the base of transistor 32 will vary. To alleviate this second order concern and provide complete temperature compensation, a diode 52 is provided in the output section of the bandgap reference voltage generator as shown in FIG. 3. Some compensation would be provided by any diode in this leg of the bandgap reference voltage generator. However, to provide precise compensation, in the preferred embodiment, the type and rating of diode 52 will be the same as the type and rating of diode 30 in FIG. 2. Preferably, both are Schottky diodes because it is desirable to use a Schottky diode on the input because it has lower input capacitance than a base-collector diode which, as discussed subsequently, may also be used.

The operation of the bandgap reference voltage generator of FIG. 3 follows conventional circuit principles. Briefly, the circuit provides a constant voltage over temperature at node f of approximately 1.4 volts. To understand this, consider the voltages that produce $V_f$:

$$V_f = V_e + V_{R60}$$

where $V_e$ is the base-to-emitter voltage drop through transistor 55 and $V_{R60}$ is the voltage drop across resistor 60. $V_e$ is designed to have a negative temperature dependence of approximately 1.8 mv/°C. in order to make $V_f$ constant over temperature. And the drop across resistor 60 is designed to have a positive temperature dependence of approximately 1.8 mv/°C. When the two voltages are added, $V_f + V_{R60}$, the temperature dependence will cancel and $V_f$ will be constant over temperature. To accomplish the above, $V_{R60}$ must have a positive temperature dependence of +1.8 mv/°C. Now $$V_{R60} = I \cdot R60$$

where I is the current through resistor 60. The value for resistor 60 is essentially constant over temperature so that I must have a positive temperature dependence in order for $V_{R60}$ to have a positive temperature dependence. Now $$I = I_{R61} + I_{R62}$$

where $I_{R61} = V_e/R61$ has a negative temperature dependence and $$I_{R62} = \frac{\frac{kT}{q} \ln \frac{I_{C56}}{I_{C54}}}{R62}$$

$$I_{R62} = \left(\frac{1}{R62}\right) \frac{kT}{q} \ln \left(\frac{I_{C56}}{I_{C54}}\right)$$

k = Boltzman's constant
q = Electronic charge
T = Temperature in degrees Kelvin
$I_{C56}$ = Collector current of transistor 56
$I_{C54}$ = Collector current of transistor 54

By inspecting the equation of $I_{R62}$ it can be seen that $I_{R62}$ has a positive temperature dependence since T is found in the numerator. Then, since $$V_f = V_e + V_{R60}$$

$$V_{R60} = I \cdot R60$$

$$I = I_{R61} + I_{R62}$$

$$I_{R61} = \frac{V_e}{R61}$$

$$I_{R62} = \left(\frac{1}{R62}\right) \frac{kT}{q} \ln \frac{I_{C56}}{I_{C54}}$$

$$V_f = V_e + \frac{R60 V_e}{R61} + \frac{R60 kT}{R62 q} \ln \frac{I_{C56}}{I_{C54}}$$

Now, the first two terms have negative temperature coefficients while the third term has a positive temperature coefficient. Therefore, by choosing the correct ratios of R60, R61 and R62, $V_f$ can be set to a given voltage with any temperature dependence. In the preferred embodiment $V_f = 1.4$ volts with zero temperature dependence.

Figure 6A:
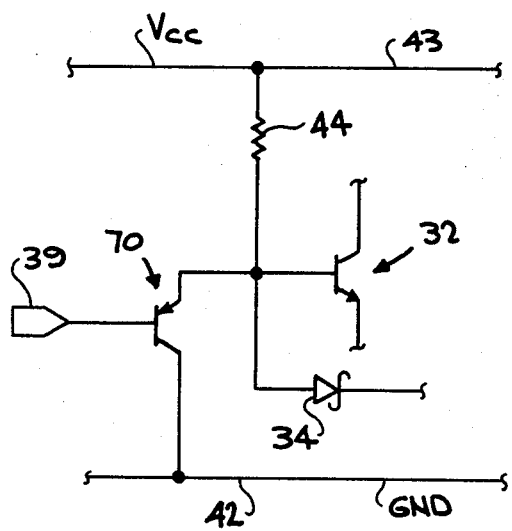
FIG. 6A is a partial circuit schematic showing the level shift circuit of FIG. 2 with a PNP transistor in its input section in place of a Schottky diode.
Figure 6B:
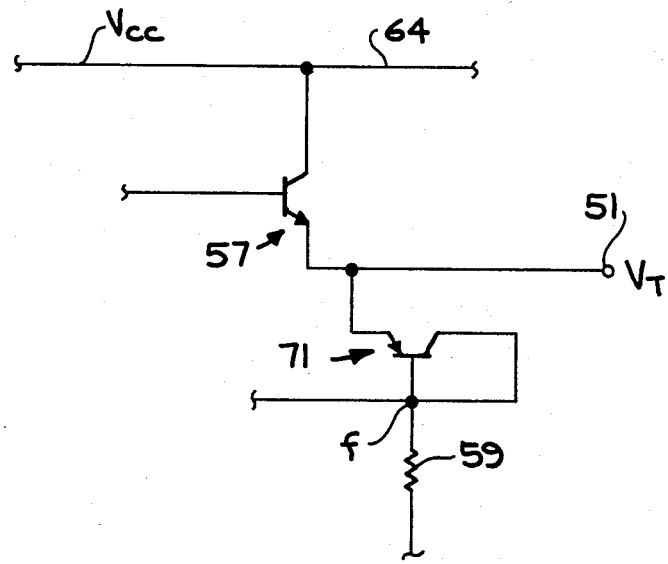
FIG. 6B is a partial circuit schematic showing the threshold voltage generator of FIG. 3 with a PNP transistor in its output section in place of a Schottky diode.

In an alternate embodiment the blocking diode used in the input section of the logic shifter could be the emitter-base junction of a PNP transistor. As shown in FIG. 6A, a partial circuit variation of FIG. 2, PNP transistor 70 has its base connected to input pin 39, its emitter connected to the base of the input transistor 32 of the differential ECL type pair 32, 33. The collector of transistor 70 is connected to ground line 42, typically the $V_{EE}$ level of −5.2 volts. An ideal PNP transistor has the advantage that the required input current, $I_{IL}$, is reduced as only the base current through the transistor 70 needs to be shunted to ground. The rest of the current goes through the collector to ground. Thus, a lower maximum low input current, $I_{IL}$, may be specified. The PNP transistor 70 still serves to block the input voltages above a certain level so that no damage is done to input transistor 32 of the ECL differential pair 32, 33. In accordance with the present invention, if a PNP transistor is used for the blocking element in the input section of the translator, as shown in FIG. 6A, then a comparable circuit element, PNP transistor 71 will be used in the bandgap reference voltage generator of FIG. 3. This is shown in a partial circuit variation of FIG. 3 shown in FIG. 6B. Here, the emitter of PNP transistor 71 is connected to the $V_T$ output line 51. The collector of PNP transistor 71 and the base are connected to node f. The function of the PNP transistor is the same as discussed for Schottky diode 52 in connection with the operation of the circuit of FIG. 3. The difference is that the temperature dependence of the PNP transistor is cancelled by the identical diode connected PNP in the bandgap reference voltage generator.

Figure 7A:
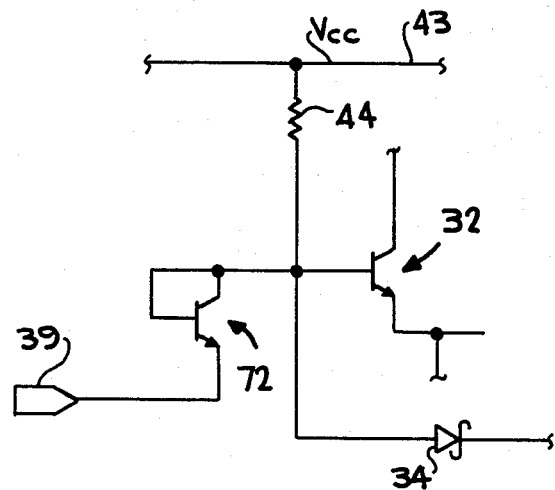
FIG. 7A is a partial circuit schematic showing the level shift circuit of FIG. 2 with an NPN transistor in its input section in place of a Schottky diode.
Figure 7B:
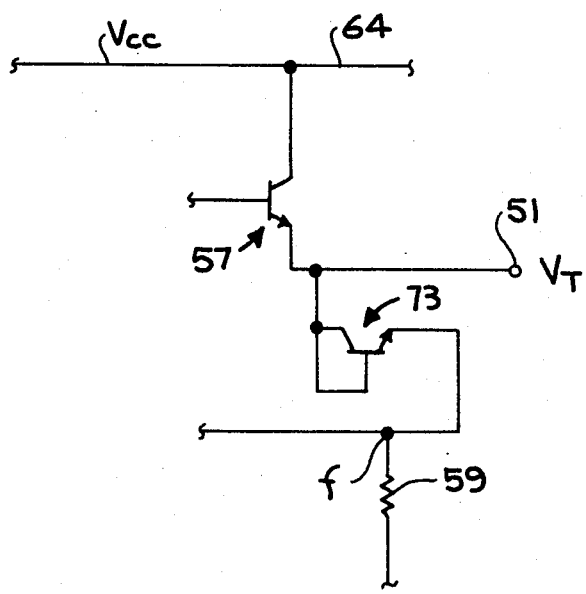
FIG. 7B is a partial circuit schematic showing the threshold voltage generator of FIG. 3 with an NPN transistor in its output section in place of a Schottky diode.

In another alternate embodiment the blocking diode used in the input section of the logic shifter can be the junction between a shorted collector-base and the emitter of an NPN transistor. As shown in FIG. 7A, a partial circuit variation of FIG. 2, NPN transistor 72 has its collector and base connected to the base of input transistor 32 and its emitter connected to input pin 39. NPN transistor 72 still serves to block the input voltages above a certain level so that no damage is done to the input transistor 32 of the ECL differential pair 32, 33. In accordance with the present invention, if an NPN transistor is used for the blocking element in the input section of the translator, as shown in FIG. 7A, then a comparable circuit element, NPN transistor 73, will be used in the bandgap reference voltage generator of FIG. 3. This is shown in a partial circuit variation of FIG. 3 shown in FIG. 7B. Here, the collector and base of NPN transistor 73 is connected to the $V_T$ output line 51. The emitter of NPN transistor 73 is connected to node f. The function of the NPN transistor is the same as discussed for Schottky diode 52 in connection with the operation of the circuit of FIG. 3. The NPN embodiment of FIGS. 7A and 7B is less preferred than the PNP embodiment of FIGS. 6A and 6B since the base-emitter junction of transistor 72 in FIG. 7A may have greater input leakage than desired.

The foregoing description of the present invention has been presented for purposes of illustration and description. It is not intended to be exhaustive or to limit the invention to the precise form disclosed, and obviously many modifications and variations are possible in light of the above teaching. The zero temperature dependence embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. In a level shift circuit for translating a voltage level representing a digital state in one logic family to a voltage level representing a digital state in another logic family and including an emitter-coupled differential transistor pair having their respective collectors connected through resistors to a supply line, having their emitters coupled together and to a current source, and further including input blocking means having temperature dependence connected from an input node to the base of one transistor of the differential transistor pair, and including a means for generating a threshold voltage, $V_T$, that is connected to the base of the other transistor of the differential transistor pair, the improvement comprising:
    said means for generating a threshold voltage, $V_T$, comprising a bandgap reference voltage generator and said bandgap reference voltage generator includes
    means for generating a temperature independent voltage at a first node, and
    a temperature dependent circuit element that tracks the temperature dependence of said input blocking means, connected between said first node and a second node, said second node supplying said threshold voltage, $V_T$.

2. An improved level shift circuit in accordance with claim 1 wherein said input blocking means comprises a first Schottky diode.

3. An improved level shift circuit in accordance with claim 2 wherein said temperature dependent circuit element in said bandgap reference voltage generator comprises a second Schottky diode.

4. An improved level shift circuit in accordance with claim 3 wherein said first and second Schottky diodes have the same rating.

5. An improved level shift circuit in accordance with claim 1 wherein said input blocking means comprises a first PNP transistor having its base connected to the input node, its collector connected to ground and its emitter connected to the base of said one transistor of said differential transistor pair.

6. An improved level shift circuit in accordance with claim 5 wherein said temperature-dependent circuit element in said bandgap reference voltage generator comprises a second PNP transistor having its emitter connected to the $V_T$ output line, its collector and base connected to the bandgap reference circuit.

7. An improved level shift circuit in accordance with claim 6 wherein said first and second PNP transistors have the same rating.

8. An improved level shift circuit in accordance with claim 1 wherein said input blocking means comprises a first NPN transistor having its emitter connected to the input node, and having its collector and base connected to the base of said one transistor of said differential transistor pair.

9. An improved level shift circuit in accordance with claim 8 wherein said temperature-dependent circuit element in said bandgap reference voltage generator comprises a second NPN transistor having its base and collector coupled to the $V_T$ output line and having its emitter coupled to the bandgap reference circuit.

10. An improved level shift circuit in accordance with claim 9 wherein said first and second NPN transistors have the same rating.

11. An improved level shift circuit in accordance with claim 1 which serves as a TTL to ECL translator wherein said input blocking means is a Schottky diode and wherein said bandgap reference voltage generator generates a TTL voltage of 1.4 volts plus a Schottky diode drop so that the minimum acceptable high input voltage, $V_{IHmin}$, for the input to said differential transistor pair is specified at about 2.0 volts and the maximum acceptable low input voltage, $V_{ILmax}$, for the input to said differential pair is specified at about 0.8 volts.

12. An improved level shift circuit in accordance with claim 11 wherein said input Schottky diode has the same voltage versus temperature characteristic as found in the Schottky diode drop produced by said bandgap reference voltage generator.

* * * * *